(12) United States Patent
Chan et al.

(10) Patent No.: US 6,486,007 B2
(45) Date of Patent: Nov. 26, 2002

(54) METHOD OF FABRICATING A MEMORY CELL FOR A STATIC RANDOM ACCESS MEMORY

(75) Inventors: Tsiu Chiu Chan, Carrollton, TX (US); Mehdi Zamanian, Carrollton, TX (US); David Charles McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/910,396

(22) Filed: Jul. 20, 2001

(65) Prior Publication Data

US 2002/0028548 A1 Mar. 7, 2002

Related U.S. Application Data

(62) Division of application No. 09/475,101, filed on Dec. 30, 1999, now Pat. No. 6,295,224.

(51) Int. Cl.[7] .............................................. H01L 21/335
(52) U.S. Cl. ....................... 438/142; 438/199; 438/229; 438/305; 365/154; 365/156; 257/59; 257/66
(58) Field of Search ................................ 438/142, 199, 438/229, 305; 257/66, 59; 365/154, 156

(56) References Cited

U.S. PATENT DOCUMENTS

| | | | |
|---|---|---|---|
| 5,521,861 A | 5/1996 | Lee et al. .................... 365/156 |
| 5,818,750 A | 10/1998 | Manning ..................... 365/154 |
| 5,852,572 A | 12/1998 | Jung et al. ................... 365/154 |
| 5,956,591 A * | 9/1999 | Fulford, Jr. .................. 438/305 |
| 5,963,803 A * | 10/1999 | Dawson et al. ............. 438/231 |
| 6,031,249 A * | 2/2000 | Yamazaki et al. ............ 257/66 |
| 6,111,780 A * | 8/2000 | Bertin ......................... 365/354 |
| 6,111,789 A | 8/2000 | Bertin ......................... 365/154 |
| 6,169,313 B1 | 1/2001 | Tsutsumi et al. ........... 257/390 |

* cited by examiner

*Primary Examiner*—Richard Elms
*Assistant Examiner*—Pho M. Luu
(74) *Attorney, Agent, or Firm*—Lisa K. Jorgenson; Andre Szuwalski

(57) ABSTRACT

A method is disclosed for a memory cell for a static random access memory. The memory cell includes a pair of cross-coupled CMOS logic inverters that are connected together to form a latch, and a pair of p-channel transmission gate transistors that are connected to the logic inverters for selectively providing access to the latch. The layout of the memory cell includes a rectangular active area in which the p-channel transistors of the memory cell are located. The rectangular active area abuts a similar active area of an adjacent memory cell along a row of memory cells so as to form a single rectangular active area for the p-channel memory cell transistors. The rectangular active area reduces the occurrence of fabrication-related phenomena that adversely effect the performance of the memory cell.

24 Claims, 3 Drawing Sheets

METHOD OF FABRICATING A MEMORY CELL FOR A STATIC RANDOM ACCESS MEMORY

This application is a divisional application of U.S. Application Ser. No. 09/476,101, filed on Dec. 30, 1999 now U.S. Pat. No. 6,295,224.

BACKGROUND OF THE INVENTION

1. Technical Field of the Invention

The present invention relates to a memory cell for a static random access memory (SRAM) device, and particularly to a circuit, layout and method of fabricating an SRAM memory cell.

2. Background of the Invention

Static random access memory (SRAM) devices have existed for a number of decades. As is well known, an SRAM memory cell includes a pair of cross-coupled logic inverters that form a latch circuit to hold data representing either a logic high level or logic low level. A pair of transmission gate transistors are connected to the cross-coupled logic inverters and provide access thereto when enabled. By connecting the control or gate terminal of the transmission gate transistors to a word line and a source/drain terminal of each transmission gate transistor to a distinct bit line of a bit line pair, data is selectively written into or read from the memory cell.

A typical implementation of the cross-coupled logic inverters is with CMOS logic inverters, each having a p-channel pull-up transistor PU and an n-channel pull-down transistor PD (FIG. 1). In addition, the transmission gate transistors TG of the SRAM memory cell traditionally have been n-channel transistors due to the carrier mobility $\mu_n$ of n-channel transistors being approximately twice the carrier mobility $\mu_p$ of p-channel transistors.

It is important for an SRAM memory cell to be well balanced. In other words, it is important to size the transistors of an SRAM memory cell relative to each other so as to avoid a destructive read operation in which the memory cell latch formed by the cross-coupled logic inverters flips logic states due to reading the data stored in the latch.

For example, consider the conventional SRAM memory cell shown in FIG. 1 in which the bit lines are biased at Vcc at the start of a read operation. Access to the memory cell data is provided by turning on the transmission gate transistors TG. Following activation of the transmission gate transistors TG, the low side inverter of the memory cell (the logic inverter L which outputs a logic low level) sinks the Vcc charge appearing on the corresponding bit line. Initially, the voltage appearing on the output of logic inverter L rises slightly due to demands on the pull-down transistor PD thereof. In order to avoid the output of logic inverter L from rising high enough to flip the state of the memory cell, the ratio of the transistor gain factor $\beta_{pd}$ of the pull-down transistor PD to the transistor gain factor $\beta_{tg}$ of the corresponding transmission gate transistor must be between approximately 2:1 and 3:1. Maintaining this ratio between the pull-down transistor PD and the corresponding transmission gate transistor TG ensures that the relative drive strength of pull-down transistors PD and transmission gate transistors TG keep the drain terminal of the pull-down transistor PD below unsafe voltage levels. With both the pull-down transistor PD and the transmission gate transistor TG being n-channel transistors and noting that the equation for the transistor gain factor $\beta$ for each transistor may be represented as $$\beta = [(\mu \epsilon)/t_{ox}]^*[W/L],$$

where $\epsilon$ and $t_{ox}$ respectively are the permittivity and thickness of the gate insulator and W and L respectively are the width and length of the transistor channel, this ratio requirement results in the ratio of the width-to-length ratio W/L of the pull-down transistor PD to the width-to-length ratio W/L of the transmission gate transistor TG being between 2:1 and 3:1.

As can be seen, a similar requirement exists for the transmission gate transistors TG relative to the pull-up transistors PU of the high side inverter if the bit lines are initially biased at Vss (also taking into consideration the differences in mobility between the n-channel transmission gate transistors TG and the p-channel pull-up transistors PU).

Based upon this transistor size requirement to prevent a destructive read operation from occurring, the n-channel transmission gate transistors TG in a conventional SRAM memory cell are sized differently from the n-channel pull-down transistors PD of the logic inverters in the memory cell. An existing layout of an SRAM memory cell is shown in FIG. 2, wherein the active area An in which the n-channel transistors of the memory cell are located includes a wider portion An1 over which the two pull-down transistors PD of the logic inverters are defined, and a thinner portion An2 over which the two transmission gate transistors TG of the memory cell are defined.

One problem in fabricating existing SRAM memory cells having active areas with this type of shape is a phenomenon known as round-off. Round-off may usually occur when SRAM devices are fabricated on a semiconductor wafer using photolithographic techniques to reduce or scale the size of the SRAM device to achieve smaller dimensions. Specifically, corners C1 of areas defining source/drain diffusion areas of pull-down transistors PD in the SRAM memory cell are typically rounded when defined in the semiconductor substrate relative to the substantially squared corners defined on a corresponding photolithographic mask. Such rounding of diffusion corners C1 adversely affects the performance of the corresponding transistor formed thereby.

Another problem experienced in fabricating existing SRAM devices is the potential for misalignment between layers of semiconductor material defining SRAM memory cell transistors, such as misalignment between gate polysilicon segments P and proximately located active areas An1 and/or source/drain diffusion areas. To combat misalignment, polysilicon segments P are spaced a distance D from active areas An1 and/or diffusion areas, which disadvantageously increase the size of the memory cell.

Based upon the foregoing, there is a need for an improved SRAM memory cell having a circuit and a layout that results in a more scalable memory cell without being adversely affected by phenomena such as round-off and misalignment of layers defining the memory cell transistors.

SUMMARY OF THE INVENTION

The present invention overcomes shortcomings in prior SRAM memory cells and satisfies a significant need for an SRAM memory cell having improved scalability and which is not adversely affected by round-off or misalignment phenomena. According to a preferred embodiment of the present invention, the pass gate transistors of the SRAM memory cell are p-channel transistors. Because the mobility $\mu_n$ of n-type semiconductor material is approximately twice the mobility $\mu_p$ of p-type semiconductor material and for a given minimum channel length L among the transistors, the width of each n-channel pull-down transistor need only be 1.0 to 1.5 times the width of the corresponding p-channel pass gate transistor in order to maintain the ratio of the transistor gain factor of the two transistors between approximately 2:1 and 3:1. Consequently, the size of the memory cell layout is reduced.

In order to improve the yield and scalability of the SRAM device, the active area for the p-channel transmission gate transistors and the p-channel pull-up transistors for each memory cell is substantially rectangular. The active area for the p-channel transistors of each memory cell abut similar active areas in adjacent memory cells in a row of memory cells, resulting in the individual active areas for the p-channel transistors forming a single rectangular active area. The active area for the n-channel transistors for each cell is also substantially rectangular. Because the active area for the p-channel transistors are substantially rectangular, round-off has less effect on memory cell performance and misalignment between the polysilicon gate segments to proximately located active areas is substantially reduced. In this way, the memory cell, according to the preferred embodiment of the present invention, is not only smaller but has improved yield.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

Figure 3:
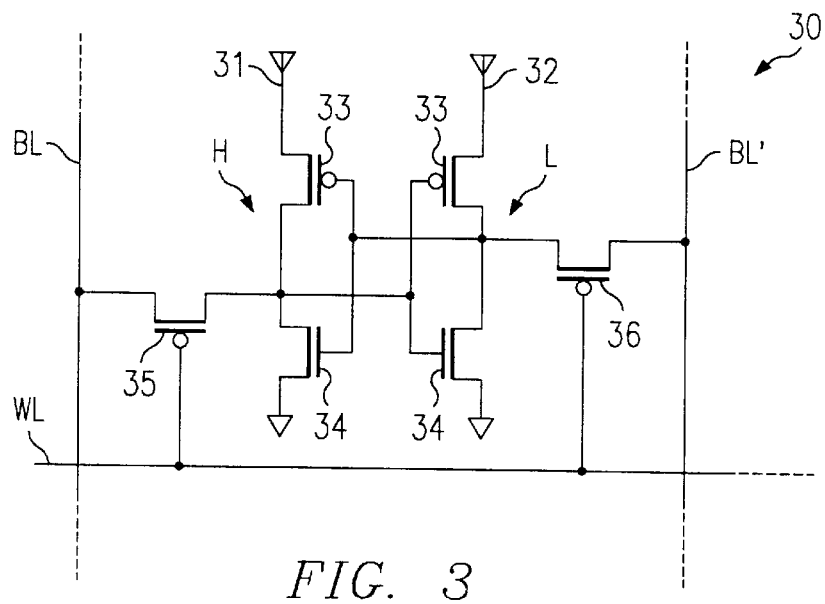
FIG. 3 is a circuit diagram of a memory cell for an SRAM device according to a preferred embodiment of the present invention.
Figure 4:
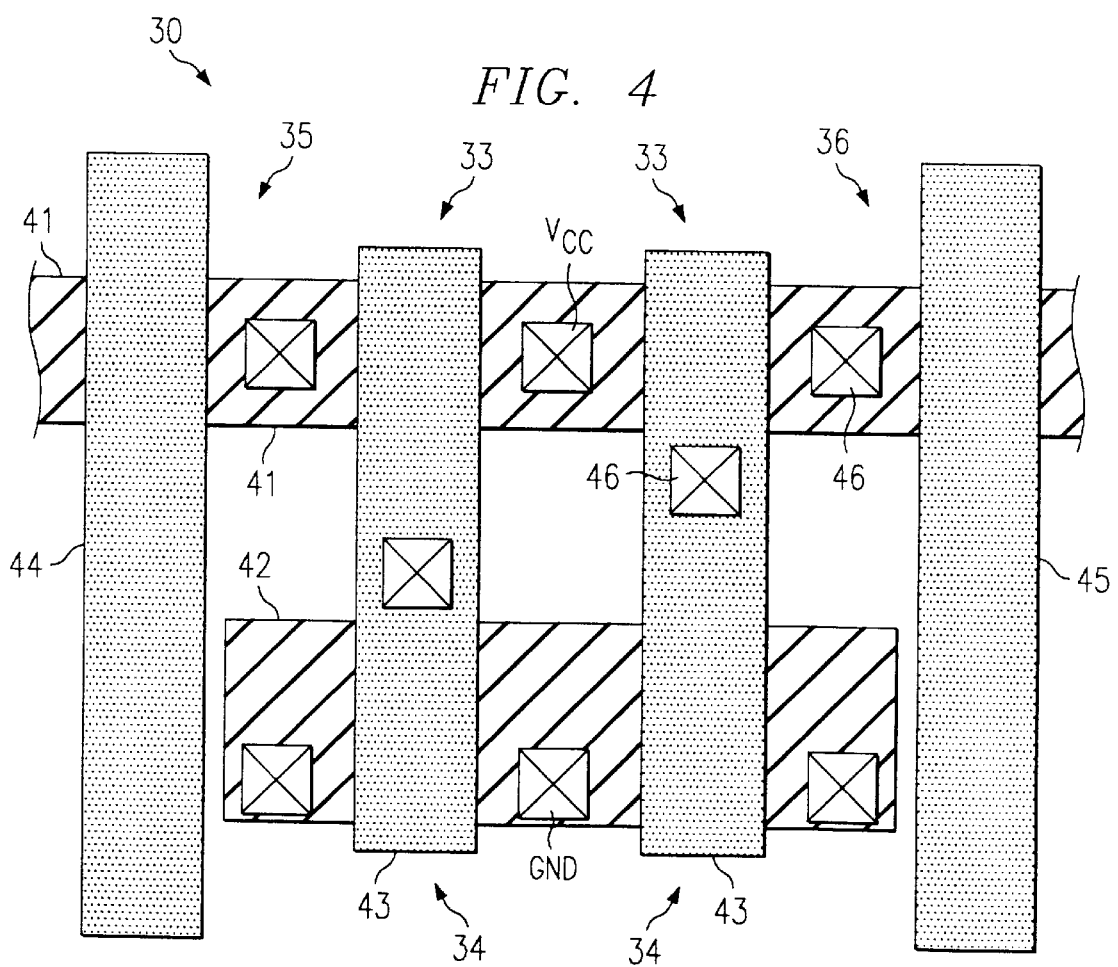
FIG. 4 is a layout of the memory cell circuit shown in FIG. 3.

Referring to FIGS. 3–4, there is shown a memory cell 30 for a static random access memory (SRAM) device according to a preferred embodiment of the present invention. The memory cell 30 is adapted to improve the yield and scalability of the SRAM device by substantially eliminating the adverse effects due to round-off and misalignment between semiconductor layers forming the transistors of the SRAM memory cells.

Memory cell 30 includes two conventional logic inverters 31 and 32 that are cross-coupled to each other to form a latch. The cross-coupled inverters 31 and 32 are selectively set to store data representing either a high or low logic level. Each logic inverter is formed from a p-channel pull-up MOS transistor 33 and an n-channel pull-down MOS transistor 34. In addition, memory cell 30 includes two transmission gate transistors 35 and 36 that provide access to cross-coupled inverters 31 and 32. Transmission gate transistors 35 and 36 are each p-channel MOS transistors.

In order to prevent the occurrence of a destructive read operation, it is necessary for transmission gate transistors 35 and 36 to be sized relative to the transistors in logic inverters 31 and 32 so that the output voltages thereof do not significantly change during the initial stages of a memory read operation. As stated above, destructive read operations are sufficiently avoided by maintaining the ratio of the transistor gain factor $\beta$ of each n-channel pull-down transistor 34 to the transistor gain factor of the corresponding transmission gate transistor 35 or 36 between approximately 2.0 and 3.0. This ratio may be mathematically expressed as $$2 < \beta_{pd}/\beta_{tg} < 3,$$

where $\beta_{pd}$ is the transistor gain factor of a pull-down transistor 34 and $\beta_{tg}$ is the transistor gain factor of a corresponding transmission gate transistor 35 or 36. Substituting the equations for each transistor gain factor yields $$2 < [(\mu_n \epsilon/t_{ox})(W_{pd}/L_{pd})]/[(\mu_p \epsilon/t_{ox})(W_{tg}/L_{tg})] < 3,$$

where $W_{pd}$ and $L_{pd}$ respectively are the channel width and length of pull-down transistor 34 and $W_{tg}$ and $L_{tg}$ respectively are the channel width and length of the corresponding transmission gate transistor 35 or 36. With the mobility $\mu_n$ of n-type material being approximately twice the mobility $\mu_p$ of p-type material, the transistor gain factor ratio realizes a relationship between the size of the n-channel pull-down transistors 34 and the size of the p-channel transmission gate transistors 35 and 36 as $$1 < (W_{pd}/L_{pd})/(W_{tg}/L_{tg}) < 1.5.$$

In other words, because of the difference in mobility between n-type and p-type semiconductor material, the size of the n-channel pull-down transistors 34 do not have to be twice the size of p-channel transmission gate transistors 35 and 36. This results in a reduction in size of memory cell 30, especially for a memory cell 30 that utilizes substantially minimum sized transmission gate transistors 35 and 36.

In the event that the bit lines BL and BL' are biased at Vss at the start of a read operation, it can be seen that the ratio of the width-to-length ratio of a pull-up transistor 33 to the width-to-length ratio of a corresponding transmission gate transistor 35 or 36 must also fall within a specified range in order to prevent a destructive read operation from occurring. In the present case, a destructive read operation may be avoided by transmission gate transistor 35 and 36 being approximately the same size as pull-up transistors 33.

Performing a write operation also presents limitations on the relative size of transmission gate transistors 35 and 36. For performing a write operation with the bit lines initially biased at Vss, for example, one bit line BL' will be driven to Vcc and the other bit line BL will remain at Vss. The output of high side inverter H will drop slightly following execution of the write operation. With low side inverter L driving a low logic level prior to the write operation, transmission gate transistor 36 must be strong enough to overcome pull-down transistor 35 of low side inverter L so as to flip the state of the memory cell latch.

With respect to performing a write operation with the bit lines initially biased at Vcc, one bit line BL will be driven to Vss and the other bit line BL' will remain at Vcc. The output of low side inverter L will rise slightly following execution of the write operation. With high side inverter H driving a high logic level prior to the write operation, transmission gate transistor 35 will pull the output of high side inverter H low. In this instance, two p-channel transistors (transmission gate transistor 35 and pull-up transistor 33 of high side inverter H) are initially "fighting" each other, so that the "fighting" is balanced and thus tracks over process corners. As a result, the writeability of memory cell 30 does not vary based upon process variations. Eventually, the output of high side inverter H is pulled low enough to cause the memory cell latch to flip states.

Figure 1:
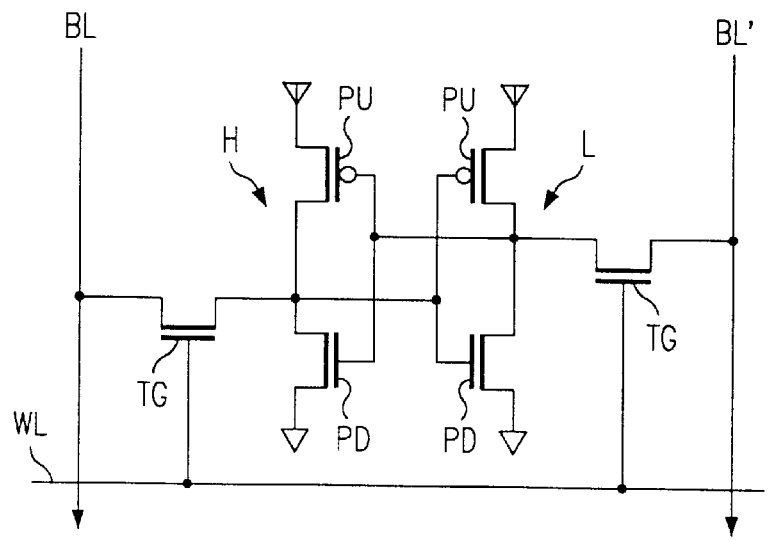
FIG. 1 is a circuit diagram of a conventional memory cell for a static random access memory (SRAM) device.
Figure 2:
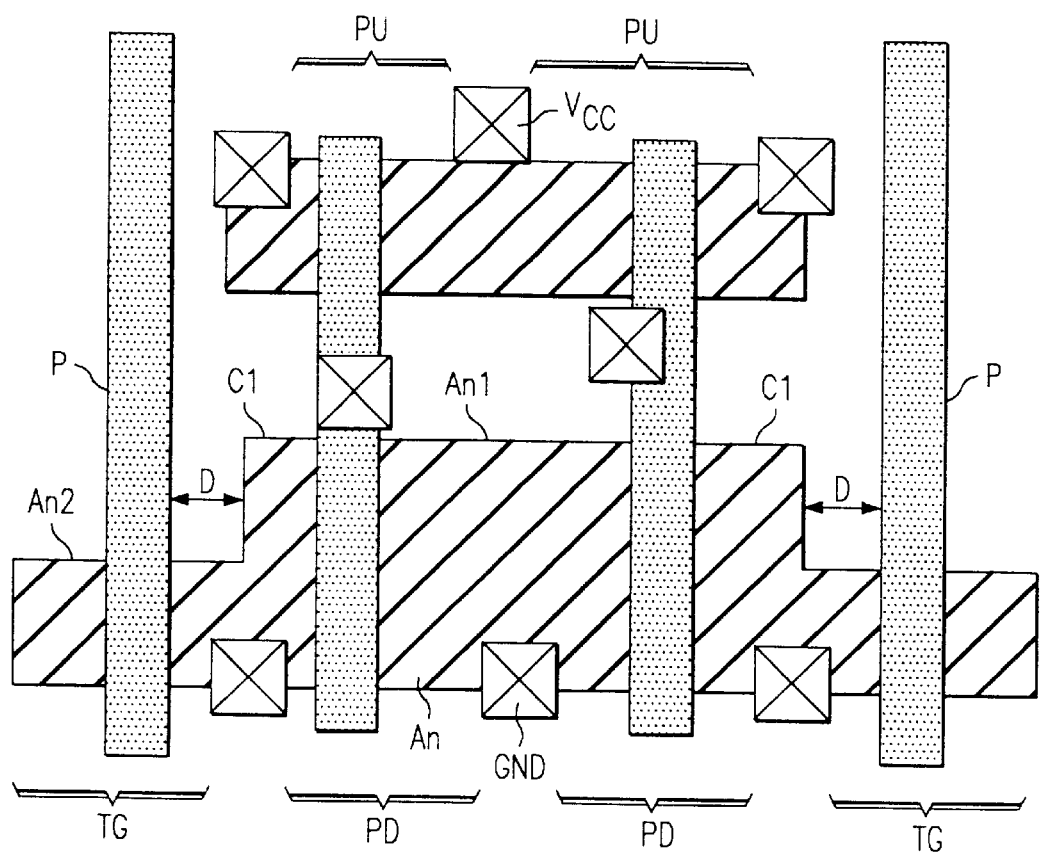
FIG. 2 is a layout of the conventional memory cell shown in FIG. 1.

FIG. 4 illustrates a layout of pertinent layers of semiconductor material of memory cell 30 according to the preferred embodiment of the present invention. As can be seen, the four p-channel transistors 33, 35 and 36 are arranged in a row within active area 41, with p-channel pull-up transistors 33 appearing between p-channel transmission gate transistors 35 and 36. N-channel pull-down transistors 34 are located in a second active area 42. Each polysilicon segment 43 forms the gate electrode for the pull-up transistor 33 and pull-down transistor 34 for a distinct one of logic inverters 31 and 32 (FIG. 2). Polysilicon segments 44 and 45 respectively form the gate electrode for transmission gate transistors 35 and 36. Polysilicon segments 43–45 are disposed over a semiconductor material substantially parallel with each other and orthogonal to a longitudinal direction of active areas 41 and 42. Because of the substantially rectangular shapes and orientation of the transistor components of memory cell 30, memory cell 30 is more manufacturable and shrinkable.

In addition to memory cell 30 providing a reduced layout relative to conventional SRAM memory cells employing n-channel transmission gate transistors, the layout of memory cell 30 substantially prevents the occurrence of round-off during fabrication. Specifically, the active area 41 of memory cell 30 is substantially rectangular and abuts the active area 41 of memory cells that are adjacent memory cell 30 along the same row of memory cells so as to form a single rectangular active area. As a result, there are no p-channel transistors having corners of source/drain diffusion regions that are susceptible to performance degradation due to round-off.

There is a second benefit of a single rectangular active area 41 for memory cell 30 which abuts similarly shaped and oriented rectangular active areas 41 of adjacent memory cells along a row of memory cells. Rectangular active area 41 substantially reduces misalignment between polysilicon segments 44 and 45 and proximately located active areas in memory cell 30, primarily because there are no such proximately located active areas between polysilicon segments 44 and 45 and active area 41, and because a field isolation oxide separates polysilicon segments 44 from active area 42.

Figure 5:
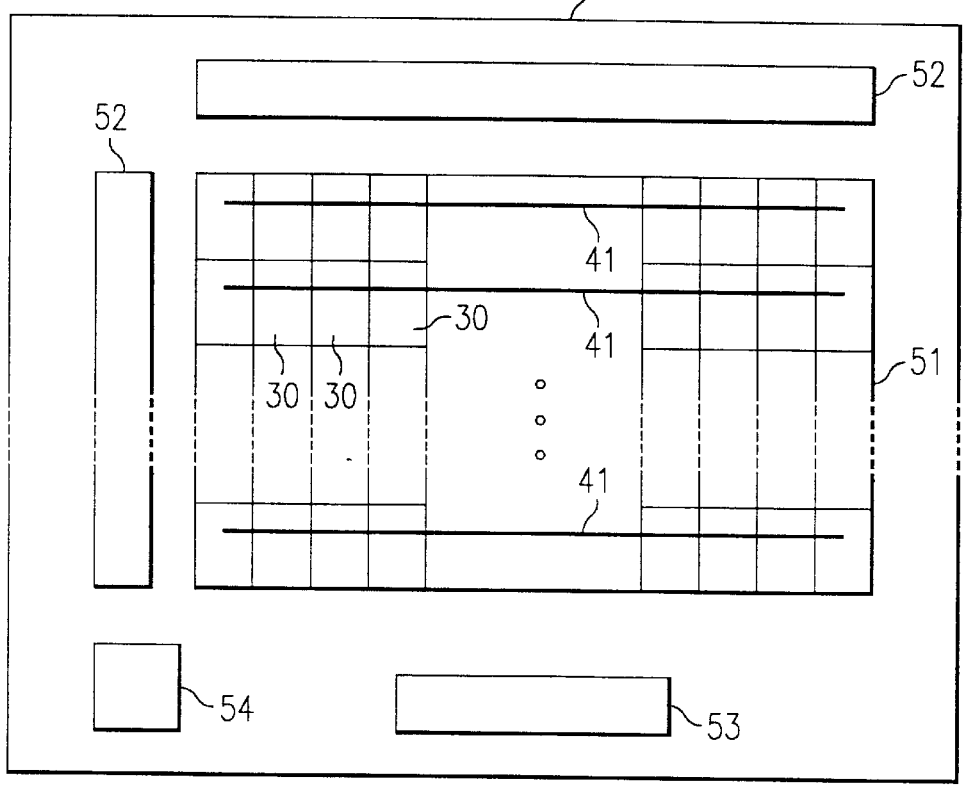
FIG. 5 is a block diagram of a portion of an SRAM device according to the preferred embodiment of the present invention.

FIG. 5 is a portion of an SRAM device 50 showing a plurality of rows of memory cells 30 forming a memory cell array 51. Addressing logic 52, input/output circuitry 53 and control logic 54 are included in the SRAM device 50 to access memory cell array 51. As shown, memory cells 30 are disposed immediately adjacent each other along a row of memory cells 30.

Figure 6:
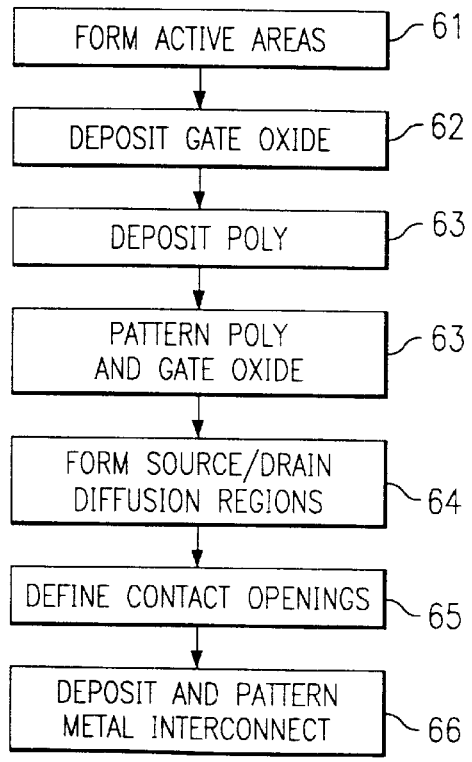
FIG. 6 is a flow chart illustrating a method of fabricating the memory cell of FIG. 4.

The fabrication of memory cell 30 will be described with respect to FIG. 6. Initially, active areas 41 and 42 are individually formed over a semiconductor substrate at step 61. Next, a thin gate oxide is formed over active areas 41 and 42 at step 62 to form the gate oxide for the transistors of memory cell 30. Polysilicon segments 43-45 are formed at step 63 over the gate oxide and then patterned so as to define the gate terminal and gate oxide for the memory cell 30 transistors. It is understood that additional processing steps may be undertaken following or during the forming of polysilicon segments 43–45 in order to lower the resistivity thereof. Next, source/drain diffusion regions are individually defined in the semiconductor substrate at step 64 for the n-channel and p-channel transistors in sequential diffusion procedures. Next, contact openings 46 are defined over memory cell 30 at step 65 to provide an electrical connection at various positions therein. At least one layer of metal or other conductive material is then formed over memory cell 30 at step 66 to at least provide intra-cell electrical connections.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a memory cell on a semiconductor substrate, comprising the steps of:

defining a first active area on the semiconductor substrate for p-channel transistors of the static memory cell having a substantially rectangular shape;

defining a second active area on the semiconductor substrate for n-channel transistors of the static memory cell having a substantially rectangular shape;

depositing an insulator layer over the first and second active areas of the semiconductor substrate;

depositing and patterning a polysilicon layer over the semiconductor substrate so as to form gate regions of two n-channel transistors in the second active area and four p-channel transistors in the first active area;

forming source and drain diffusion regions for the p-channel transistors;

forming source and drain diffusion regions for the n-channel transistors; and forming one or more metal layers over the semiconductor substrate so as to connect two of the four p-channel transistors and the n-channel transistors together to form a pair of cross-coupled inverters, and connect the other of the two four p-channel transistors to the cross-coupled inverters to form transmission gate transistors of the memory cell;

wherein the step of defining the first active area defines the first active area so as to abut one or more first active areas of one or more other memory cells defined on the semiconductor substrate, the abutted active areas forming a single substantially rectangular active area.

2. The method of claim 1, wherein:

the step of depositing and patterning a polysilicon layer forms polysilicon segments over the semiconductor substrate that are substantially in parallel with each other.

3. The method of claim 1, wherein:

the steps of depositing and patterning a polysilicon layer and forming source and drain diffusion regions forms the p-channel transmission gate transistors and the p-channel transistors of the cross-coupled inverters as having approximately the same size.

4. The method of claim 1, wherein:

the drain region of each of the n-channel transistors defines an end portion of the second active area.

5. A method of fabricating a memory cell on a semiconductor substrate, comprising the steps of:

defining a first active area on the semiconductor substrate for p-channel transistors of the static memory cell having a substantially rectangular shape;

defining a second active area on the semiconductor substrate for n-channel transistors of the static memory cell having a substantially rectangular shape;

depositing an insulator layer over the first and second active areas of the semiconductor substrate;

depositing and patterning a polysilicon layer over the semiconductor substrate so as to form gate regions of two n-channel transistors in the second active area and four p-channel transistors in the first active area;

forming source and drain diffusion regions for the p-channel transistors;

forming source and drain diffusion regions for the n-channel transistors; and forming one or more metal layers over the semiconductor substrate so as to connect two of the four p-channel transistors and the n-channel transistors together to form a pair of cross-coupled inverters, and connect the other two of the four p-channel transistors to the cross-coupled inverters to form transmission gate transistors of the memory cell;

the steps of depositing and patterning a polysilicon layer, forming source and drain diffusion regions for the n-channel transistors and forming source and drain diffusion regions for the p-channel transistors form the p-channel transmission gate transistors as having a first width-to-length ratio and the n-channel transistors as having a second width-to-length ratio such that the ratio of the second width-to-length ratio to the first width-to-length ratio is between approximately 1.0 and approximately 1.5.

6. A method of fabricating a memory device on a semiconductor substrate, comprising the steps of:

defining one or more first active areas having a substantially rectangular shape on the semiconductor substrate for transistors of a first type in a row of memory cells;

defining one or more second active areas having a substantially rectangular shape on the semiconductor substrate for transistors of a second type in the row of memory cells;

depositing an insulator layer over the one or more first active areas and the one or more second active areas of the semiconductor substrate;

depositing and patterning a polysilicon layer over the semiconductor substrate so as to form gate regions of the transistors of the second type in the one or more second active areas and gate regions of the transistors of the first type in the one or more first active areas;

forming source and drain diffusion regions for the transistors of the first type in the one or more first active areas;

forming source and drain diffusion regions for the transistors of the second type in the one or more second active areas; and forming one or more electrically conductive layers over the semiconductor substrate so as to connect together transistors of the first type in the one or more first active areas and transistors of the second type in the one or more second active areas to form pairs of cross-coupled inverters for memory cells in the row;

wherein the step of forming one or more electrically conductive layers connects transistors of the first type in the one or more first active areas to the cross-coupled inverters to form transmission gate transistors for memory cells in the row.

7. The method of claim 6, wherein:

the steps of depositing and patterning a polysilicon layer, forming source and drain diffusion regions for the transistors of the first type and forming source and drain diffusion regions for the transistors of a second type form the transmission gate transistors in the one or more first active areas as having a first width-to-length ratio and the transistors of a second type in the one or more second active areas as having a second width-to-length ratio such that the ratio of the second width-to-length ratio to the first width-to-length ratio is between approximately 1.0 and approximately 1.5.

8. The method of claim 6, wherein:

the steps of depositing and patterning a polysilicon layer, forming source and drain diffusion regions of the transistors of the first type and forming source and drain diffusion regions of the transistors of the second type form the transmission gate transistors and the transistors of the first type as having approximately the same size.

9. The method of claim 6, wherein:

the transistors of the first type comprise p-channel transistors; and the transistors of the second type comprise n-channel transistors.

10. The method of claim 6, wherein:

the step of depositing and patterning a polysilicon layer forms polysilicon segments over the semiconductor substrate that are substantially parallel with each other.

11. The method of claim 6, wherein:

the drain region of each of the transistors of a second type defines an end portion of the one or more second active areas.

12. The method of claim 6, wherein:

the step of defining the one or more first active areas defines a single first active area in the row.

13. The method of claim 6, wherein:

the step of defining the one or more first active areas defines a plurality of first active areas, each first active area having transistors of the first type for a distinct memory cell and abutting at least one other first active area in the row so as to form a single substantially rectangular first active area.

14. The method of claim 6, wherein:

the step of defining one or more first active areas comprises defining a plurality of first active areas for transistors of the first type in a plurality of rows of memory cells.

15. The method of claim 14, wherein:

each of at least some of the rows of memory cells includes a single first active area.

16. The method of claim 14, wherein:

the step of defining one or more second active areas comprises defining a plurality of second active areas for transistors of a second type of memory cells in the plurality of rows of memory cells.

17. A method of fabricating a memory cell on a semiconductor substrate, comprising the steps of:

defining a first active area on the semiconductor substrate having a substantially rectangular shape for transistors of the static memory cell having a first conductivity type;

defining a second active area on the semiconductor substrate having a substantially rectangular shape for transistors of the static memory cell having a second conductivity type;

depositing an insulator layer over the first and second active areas of the semiconductor substrate;

depositing and patterning a polysilicon layer over the semiconductor substrate so as to form gate regions of the transistors of the first conductivity type in the first active area and the transistors of the second conductivity type in the second active area;

forming source and drain diffusion regions for the transistors of the first conductivity type;

forming source and drain diffusion regions for the transistors of the second conductivity type; and forming one or more layers of electrically conductive material over the semiconductor substrate so as to connect together transistors of the first conductivity type and transistors of the second conductivity type to define a pair of cross-coupled inverters of the memory cell;

wherein the step of forming one or more layers of electrically conductive material connects transistors of the first type to the cross-coupled inverters to define transmission gate transistors of the memory cell.

18. The method of claim 17, wherein:

the step of depositing and patterning a polysilicon layer forms polysilicon segments over the semiconductor substrate that are substantially in parallel with each other.

19. The method of claim 17, wherein:

the steps of depositing and patterning a polysilicon layer and forming source and drain diffusion regions for the transistors of the first type form the p-channel transmission gate transistors and the p-channel transistors of the cross-coupled inverters as having approximately the same size.

20. The method of claim 17, wherein the first active area abuts a first active area of another memory cell on the semiconductor substrate.

21. The method of claim 17, wherein the first active area abuts a first active area of another memory cell on the semiconductor substrate to form a single active area having a substantially rectangular shape.

22. The method of claim 17, wherein the first active area abuts a first active area of at least one other memory cell on the semiconductor substrate to form a single active area having a substantially polygonal shape.

23. A method of fabricating a memory cell on a semiconductor substrate, comprising the steps of:

defining a first active area on the semiconductor substrate having a substantially rectangular shape for transistors of the static memory cell having a first conductivity type;

defining a second active area on the semiconductor substrate having a substantially rectangular shape for transistors of the static memory cell having a second conductivity type;

depositing an insulator layer over the first and second active areas of the semiconductor substrate;

depositing and patterning a polysilicon layer over the semiconductor substrate so as to form gate regions of the transistors of the first conductivity type in the first active area and the transistors of the second conductivity type in the second active area;

forming source and drain diffusion regions for the transistors of the first conductivity type;

forming source and drain diffusion regions for the transistors of the second conductivity type; and forming one or more layers of electrically conductive material over the semiconductor substrate so as to connect together transistors of the first conductivity type and transistors of the second conductivity type to define a pair of cross-coupled inverters of the memory cell;

wherein the steps of depositing and patterning a polysilicon layer, forming source and drain diffusion regions for the transistors of the first conductivity type and forming source and drain diffusion regions for the transistors of the second type form the transmission gate transistors as having a first width-to-length ratio and the transistors of the second conductivity type as having a second width-to-length ratio such that the ratio of the second width-to-length ratio to the first width-to-length ratio is between approximately 1.0 and approximately 1.5.

24. A method of fabricating an array of memory cells on a semiconductor substrate, comprising the steps of:

defining a first active area having a substantially rectangular shape on the semiconductor substrate for transistors of a first type appearing in two or more memory cells in a row of memory cells;

defining one or more second active areas having a substantially rectangular shape on the semiconductor substrate for transistors of a second type in the row of memory cells;

depositing an insulator layer over the first active areas and the one or more second active areas of the semiconductor substrate;

depositing and patterning a layer over the semiconductor substrate so as to form gate regions of the transistors of the second type in the one or more second active areas and gate regions of the transistors of the first type in the first active area;

forming source and drain diffusion r egions for the transistors of the first type in the first active area;

forming source and drain diffusion regions for the transistors of the second type in the one or more second active areas; and forming one or more electrically conductive layers over the semiconductor substrate so as to connect together transistors of the first type in the one or more first active areas and transistors of the second type in the one or more second active areas.

* * * * *

UNITED STATES PATENT AND TRADEMARK OFFICE
CERTIFICATE OF CORRECTION

PATENT NO.     : 6,486,007 B2
DATED          : November 26, 2002
INVENTOR(S)    : Tsiu Chiu Chan et al.

It is certified that error appears in the above-identified patent and that said Letters Patent is hereby corrected as shown below:

Column 6,
Line 36, replace "other of the two four p-channel" with -- other two of the four p-channel --

Column 10,
Line 45, replace "r egions" with -- regions --

Signed and Sealed this

Nineteenth Day of August, 2003

JAMES E. ROGAN
*Director of the United States Patent and Trademark Office*